United States Patent
Arakida et al.

(10) Patent No.: US 8,488,647 B2
(45) Date of Patent: Jul. 16, 2013

(54) SEMICONDUCTOR LIGHT EMITTING DEVICE

(75) Inventors: Takahiro Arakida, Kanagawa (JP); Shiro Uchida, Tokyo (JP); Masaki Shiozaki, Kanagawa (JP); Osamu Maeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 15 days.

(21) Appl. No.: 12/923,634

(22) Filed: Sep. 30, 2010

(65) Prior Publication Data
US 2011/0096806 A1 Apr. 28, 2011

(30) Foreign Application Priority Data
Oct. 28, 2009 (JP) ................................ 2009-248117

(51) Int. Cl.
*H01S 5/00* (2006.01)
(52) U.S. Cl.
USPC .................. 372/50.21; 372/50.1; 372/50.124
(58) Field of Classification Search
USPC ................. 372/50.1, 50.21, 50.124
See application file for complete search history.

(56) References Cited

U.S. PATENT DOCUMENTS

| | | | |
|---|---|---|---|
| 5,887,013 A | 3/1999 | Lee et al. | |
| 6,034,981 A * | 3/2000 | Kim, II | 372/50.21 |
| 6,535,538 B1 * | 3/2003 | Lee et al. | 372/50.21 |
| 6,678,307 B2 * | 1/2004 | Ezaki et al. | 372/96 |
| 7,423,294 B2 | 9/2008 | Koda et al. | |
| 7,601,987 B2 | 10/2009 | Koda et al. | |
| 2005/0161687 A1 * | 7/2005 | Kaneko | 257/94 |
| 2005/0180481 A1 | 8/2005 | Kaneko et al. | |
| 2006/0007979 A1 * | 1/2006 | Jikutani et al. | 372/92 |
| 2006/0192088 A1 * | 8/2006 | Koyama | 250/214 R |
| 2009/0003386 A1 * | 1/2009 | Koda et al. | 257/79 |
| 2009/0129417 A1 | 5/2009 | Maeda et al. | |

FOREIGN PATENT DOCUMENTS

| | | |
|---|---|---|
| JP | 2877785 | 1/1999 |
| JP | 2007-324313 | 12/2007 |
| JP | 2008-016824 A | 1/2008 |
| JP | 4164679 | 8/2008 |
| JP | 2008-258270 | 10/2008 |

* cited by examiner

*Primary Examiner* — Jessica Stultz
*Assistant Examiner* — Phillip Nguyen
(74) *Attorney, Agent, or Firm* — Rader, Fishman & Grauer PLLC

(57) ABSTRACT

The present invention provides a semiconductor light emitting device realizing increased light detection precision by a simple manufacture process. One or more second oxidation layers are provided between an active layer and a semiconductor light detecting element in addition to a first oxidation layer for narrowing current. Since natural emission light includes many divergence components, the natural emission light is reflected and scattered by the second oxidation layer, and propagation of the natural emission light to the semiconductor light detecting element side is suppressed. The detection level of the natural emission light by the semiconductor light detecting element decreases, and light detection precision increases. The first and second oxidation layers are formed by a single oxidizing process so that the manufacturing process is simplified.

29 Claims, 4 Drawing Sheets

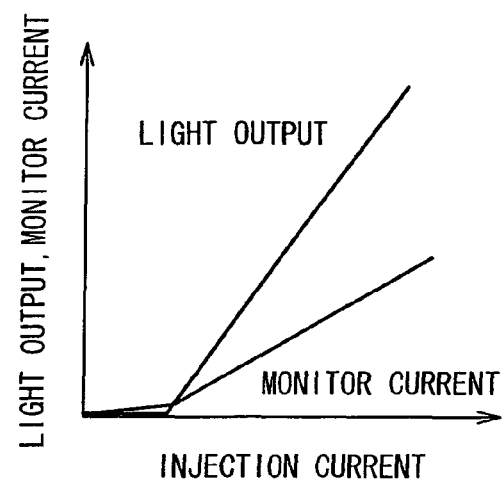
FIG. 4A  SECOND OXIDATION LAYER IS PRESENT
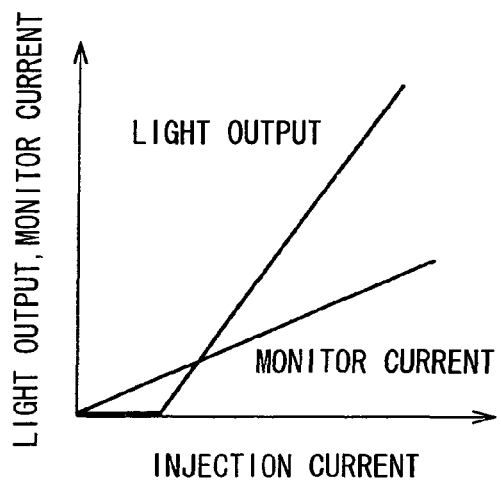
FIG. 4B  SECOND OXIDATION LAYER IS ABSENT

SEMICONDUCTOR LIGHT EMITTING DEVICE

BACKGROUND OF THE INVENTION

1. Field of the Invention

The present invention relates to a semiconductor light emitting device having a light detecting element for detecting emission light and, more particularly, to a semiconductor light emitting device suitable for use in which light detection precision is highly desired.

2. Description of the Related Art

In a semiconductor light emitting device for use of an optical fiber, an optical disk, or the like as a related art, as part of a purpose of maintaining the light output level of a semiconductor light emitting element which is assembled in the device, light emitted from the semiconductor light emitting element is detected by a light detecting mechanism. The light detecting mechanism may be constructed by, for example, a reflector for branching a part of emission light and a semiconductor light detecting element for detecting the branched emission light. The configuration, however, has problems such that the number of parts is large and, in addition, the reflector and the semiconductor light detecting element have to be disposed with high precision with respect to the semiconductor light emitting element. As one of measures to solve such problems, the semiconductor light emitting element and the semiconductor light detecting element are integrally formed.

However, when they are formed integrally, there is the possibility that the semiconductor light detecting element detects not only induced emission light to be detected but also natural emission light. In such a case, the light output level of the semiconductor light emitting element measured on the basis of light detected by the semiconductor light detecting element includes an error only by the amount of natural emission light. Therefore, this method is not also suitable for use in which the light output level is desired to be controlled with high precision.

In Japanese Patent No. 2,877,785, a technique is proposed, of providing a control layer in a semiconductor light detecting element and interrupting light before a part of natural emission light emitted from a surface-emitting semiconductor laser element is detected by the semiconductor light detecting element.

SUMMARY OF THE INVENTION

The control layer is formed by oxidizing a part of a semiconductor material of the semiconductor light detecting element. However, since the mesa diameter of the control layer of the semiconductor light detecting element and that of a current narrowing layer in a surface-emitting semiconductor laser element are different from each other, it is extremely difficult to control a desired oxidation amount by a single oxidizing process. In the case of executing a plurality of oxidizing processes, the processes are complicated, and the productivity deteriorates extremely.

It is therefore desirable to provide a semiconductor light emitting device realizing increased light detection precision by a simple manufacturing process.

A semiconductor light emitting device as an embodiment of the present invention has a semiconductor light detecting element on a substrate, and a surface-emitting semiconductor laser element on the semiconductor light detecting element. The surface-emitting semiconductor laser element has: a first multilayer reflection film on the semiconductor light detecting element; an active layer provided on the first multilayer reflection film and including a light emission region; a second multilayer reflection film on the active layer; a first oxidation layer provided in the first or second multilayer reflection film, having a current aperture for passing current so as to be opposed to the light emission region in the active layer, and having an oxidation region at the outer periphery of the current aperture; and one or more second oxidation layers provided between the active layer and the semiconductor light detecting element, having a current aperture so as to be opposed to the current aperture in the first oxidation layer, and having an oxidation region at the outer periphery of the current aperture.

In the semiconductor light emitting device as an embodiment of the invention, induced emission repeats in the surface-emitting semiconductor laser element, so that light including a predetermined wavelength is output. The light includes not only the induced-emission light but also natural emission light. Since one or more second oxidation layers are provided between the active layer and the semiconductor light detecting element, propagation of the natural emission light to the semiconductor light detecting element is suppressed, and the detection level of natural emission light by the semiconductor light detecting element is reduced.

According to the semiconductor light emitting device as an embodiment of the invention, since one or more second oxidation layers each having a current aperture so as to be opposed to the current aperture in the first oxidation layer are provided between the active layer and the semiconductor light detecting element, propagation of the natural emission light to the semiconductor light detecting element may be suppressed by the second oxidation layer, and light detection precision may be increased. The first and second oxidation layers are formed in a single oxidation process, and the manufacturing process becomes simpler.

Other and further objects, features and advantages of the invention will appear more fully from the following description.

BRIEF DESCRIPTION OF THE DRAWINGS

FIGS. 4A and 4B are views illustrating a result of examples.

DETAILED DESCRIPTION OF THE PREFERRED EMBODIMENTS

Embodiments of the present invention will be described in detail below with reference to the drawings.

Figure 1:
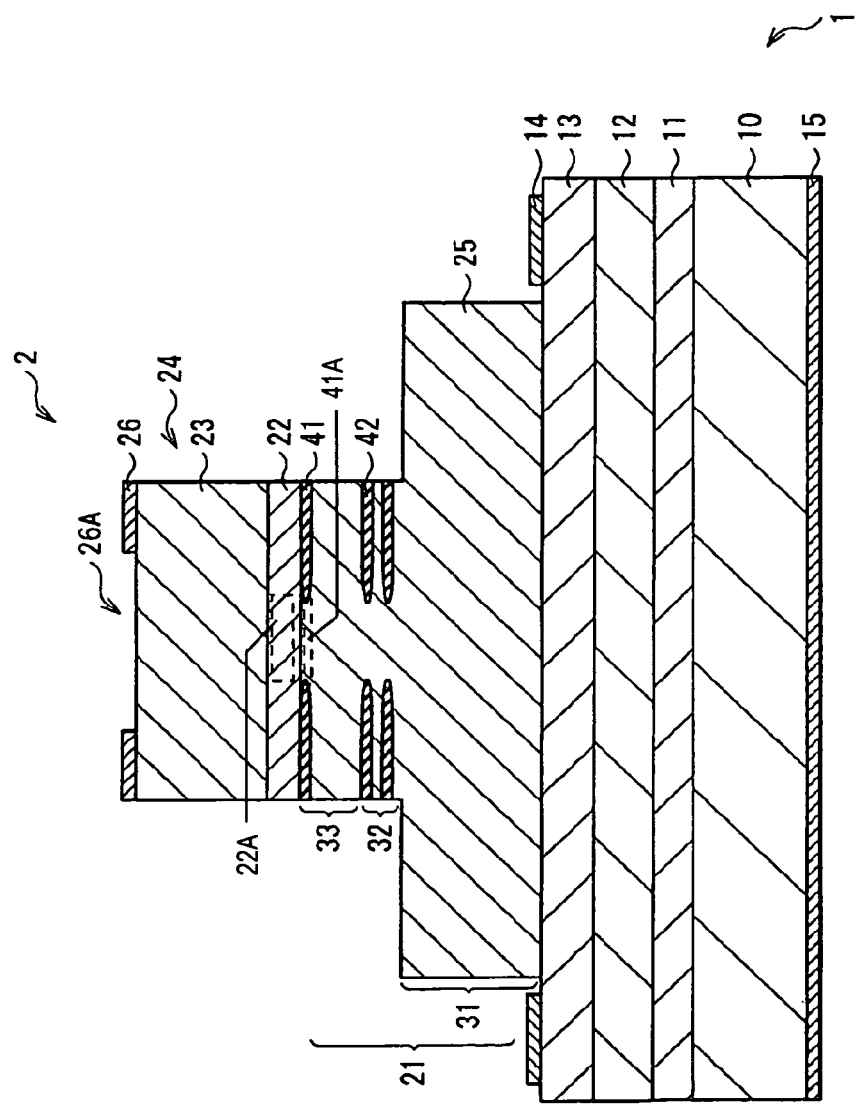
FIG. 1 is a cross section illustrating a configuration example of a semiconductor light emitting device according to an embodiment of the present invention.

FIG. 1 shows a sectional configuration of a semiconductor light emitting device according to an embodiment of the invention. FIG. 1 is a schematic view in which dimensions and shapes are different from actual ones. The semiconductor light emitting device is obtained by integrally providing a surface-emitting semiconductor laser element 2 on a semiconductor light detecting element 1.

The semiconductor light detecting element 1 has, on a substrate 10, an n-type contact layer 11, a light absorption layer 12, and a p-type contact layer 13 in this order. A p-side electrode 14 is provided on the surface of the p-type contact layer 13, and an n-side electrode 15 is provided on the rear face of the substrate 10. The p-side electrode 14 also functions as a p-side electrode of the surface-emitting semiconductor laser element 2.

The substrate 10 is made of, for example, n-type GaAs. The n-type contact layer 11 is made of, for example, n-type $Al_{x11}Ga_{1-x11}As$ ($0 \leq x \leq 1$). Examples of the n-type impurity include silicon (Si) and selenium (Se). The light absorption layer 12 absorbs a part of light output from the surface-emitting semiconductor laser element 2 and converts the absorbed light to an electric signal, and is made of, for example, undoped $Al_{x12}Ga_{1-x12}As$ ($0 \leq x12 \leq 1$). The p-type contact layer 13 is made of, for example, p-type $Al_{x13}Ga_{1-x13}As$ ($0 \leq x13 \leq 1$). Examples of the p-type impurity include zinc (Zn), magnesium (Mg), beryllium (Be), and carbon (C).

The p-side electrode 14 has a structure that, for example, Ti, Pt, and Au are stacked in this order from the p-type contact layer 13 side and is electrically connected to the p-type contact layer 13. The n-side electrode 15 has a structure that, for example, AuGe alloy, Ni, and Au are stacked in this order from the substrate 10 side and is electrically connected to the substrate 10.

The surface-emitting semiconductor laser element 2 has a stack structure obtained by stacking, on the p-type contact layer 13 of the semiconductor light detecting element 1, for example, a p-type DBR layer 21, an active layer 22, and an n-type DBR layer 23 in this order from the semiconductor light detecting element 1 side. The p-type DBR layer 21 has a structure obtained by stacking a p-type first DBR layer 31, a p-type second DBR layer 32, and a p-type third DBR layer 33 in this order from the substrate 10 side. By the p-type second DBR layer 32, the p-type third DBR layer 33, the active layer 22, and the n-type DBR layer 23, a first column 24 having a cylindrical shape is formed. The p-type first DBR layer 31 serves as a second column 25 having a cylindrical shape whose diameter is larger than that of the first column 24.

A first oxidation layer 41 is provided near the active layer 22 in the p-type third DBR layer 33. The first oxidation layer 41 has a function of a current narrowing layer specifying a light emission region 22A in the active layer 22 and has a current aperture 41A for current passage, which is opposed to the light emission region 22A in the active layer 22, and has an oxidation region 41B at the outer periphery of the current aperture 41A.

A second oxidation layer 42 is provided in the p-type second DBR layer 32. The second oxidation layer 42 is provided between the active layer 22 and the semiconductor light detecting element 1 to suppress propagation of natural emission light to the semiconductor light detecting element 1 separately from the first oxidation layer 41 for narrowing current. The second oxidation layer 42 has a current aperture 42A opposed to the current aperture 41A in the first oxidation layer 41 and has an oxidation region 42B at the outer periphery of the current aperture 42A. With the configuration, in the semiconductor light emitting device, the light detection precision may be increased by the simple manufacturing process.

The current apertures 41A and 42A are made of, for example, p-type AlAs or p-type $Al_{x42}Ga_{1-x42}As$ ($0 < x42 \leq 1$). The oxidation regions 41B and 42B contain, for example, $Al_2O_3$ (aluminum oxide). The diameter of the current aperture 42A is preferably equal to or less than that of the current aperture 41A. In the case where the diameter of the current aperture 42A is wider, the natural emission light passing through the current aperture 42A and reaching the semiconductor light detecting element 1 increases.

Both of the first and second oxidation layers 41 and 42 are provided in the second column 25. With the configuration, as will be described later, by oxidizing high-density aluminum (Al) contained in the first and second oxidation layers 41 and 42 from the side face of the first column 24, the first and second oxidation layers 41 and 42 are formed in a single oxidizing process, and the manufacturing process is simplified.

The active layer 22 is made of, for example, undoped $Al_{x22}Ga_{1-x22}As$ ($0 \leq x22 \leq 1$).

The n-type DBR layer 23 is formed by alternately stacking a low-refractive-index layer (not illustrated) and a high-refractive-index layer (not illustrated). The low-refractive-index layer is made of n-type $Al_{x23}Ga_{1-x23}As$ ($0 < x23 \leq 1$) having a thickness of $\lambda 0/4n3$ (n3: refractive index), and the high-refractive-index layer is made of n-type $Al_{x24}Ga_{1-x24}As$ ($0 \leq x24 < x23$) having a thickness of $\lambda 0/4n4$ (n4: refractive index).

The surface-emitting semiconductor laser element 2 also has an n-side electrode 26 on the n-type DBR layer 23. As the p-side electrode of the surface-emitting semiconductor laser element 2, the p-side electrode 14 of the semiconductor light detecting element 1 is used as a common electrode. Obviously, a p-side electrode may be provided in addition to that of the semiconductor light detecting element 1. The n-side electrode 26 has a structure obtained by stacking, for example, an alloy of gold (Au) and germanium (Ge), nickel (Ni), and gold (Au) in this order from the n-type DBR layer 23 side, and is electrically connected to the n-type DBR layer 23. The n-side electrode 26 is formed, for example, in a doughnut shape having a current aperture 23A in correspondence with the light emission region 22A.

Figure 2:
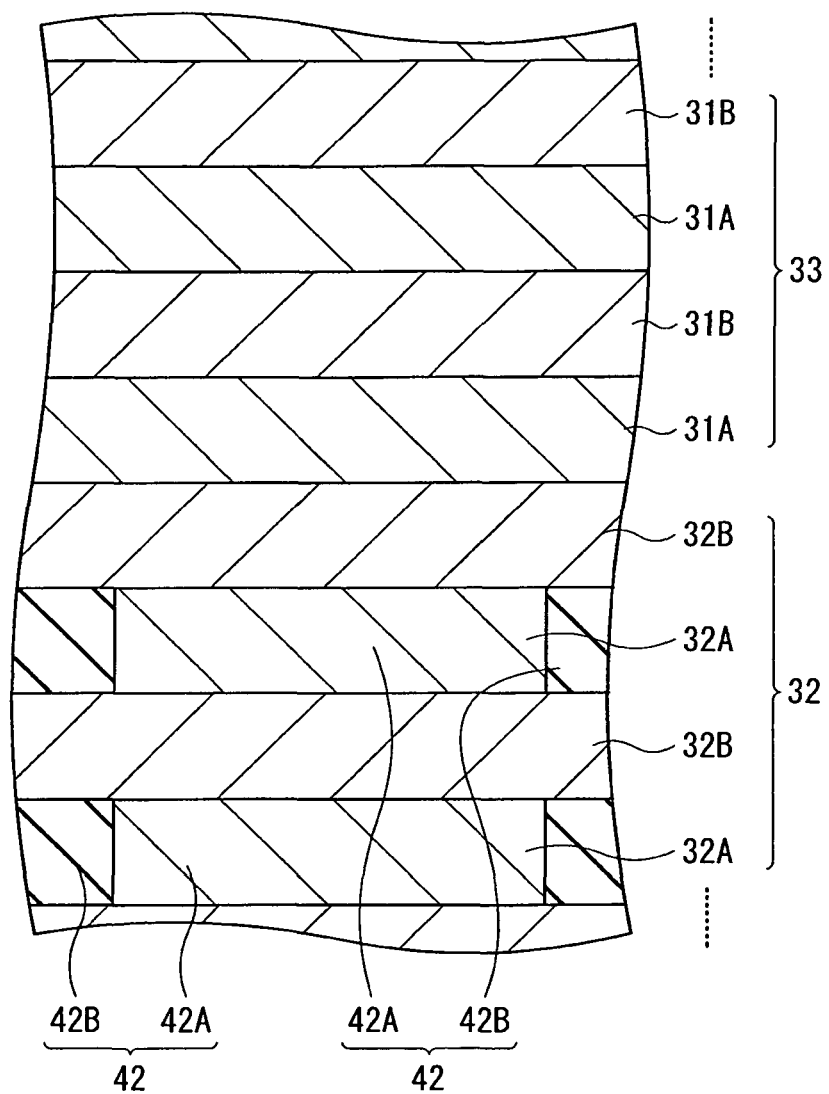
FIG. 2 is a partly enlarged cross section of a p-type DBR layer illustrated in FIG. 1.

FIG. 2 illustrates an enlarged sectional configuration of the p-type second DBR layer 32 and the p-type third DBR layer 33. The p-type third DBR layer 33 is obtained by stacking a plurality of sets each made of a low-refractive-index layer 31A and a high-refractive-index layer 31B. The low-refractive-index layer 31A is made of, for example, n-type $Al_{x31}Ga_{1-x31}As$ having an optical thickness of $\lambda/4$ ($\lambda$: oscillation wavelength), and the high-refractive-index layer 31B is made of, for example, n-type $Al_{x32}Ga_{1-x32}As$ having an optical thickness of $\lambda/4$. The p-type first DBR layer 31 has a configuration similar to that of the p-type third DBR layer 33.

The p-type second DBR layer 32 is obtained by stacking a plurality of sets each made of a low-refractive-index layer 32A and a high-refractive-index layer 32B. The low-refractive-index layer 32A is made of, for example, n-type $Al_{x33}Ga_{1-x33}As$ having an optical thickness of $\lambda/4$, and the high-refractive-index layer 32B is made of, for example, n-type $Al_{x34}Ga_{1-x34}As$ having an optical thickness of $\lambda/4$. The second oxidation layer 42 is formed by partially oxidizing the low-refractive-index layer 32A.

The values x31 to x34 of the Al compositions in the p-type DBR layer 21 satisfy the following expression 1. Consequently, the low-refractive-index layer 32A in the p-type second DBR layer 32 is more easily oxidized than the p-type first DBR layer 31 and the low-refractive-index layer 31A of the p-type third DBR layer 33 and is oxidized equally or less than the first oxidized layer 41.

$$1 \geq x41 \geq x33 > (x31, x23) > 0.8 > (x32, x34) \geq 0 \quad \text{Expression 1}$$

In the expression 1, x41 denotes the value of the Al composition contained in the material of the first oxidation layer 41, and x23 denotes the value of the Al composition contained in the material of the low-refractive-index layer of the n-type DBR layer 23. (x31, x23) denotes x31 or x23, and (x32, x34) denotes x32 or x34. The value 0.8 corresponds to the border between the refractive index of the low-refractive-index layer and the refractive index of the high-refractive-index layer.

For example, the semiconductor light emitting device is manufactured as follows.

To manufacture the semiconductor light emitting device, on the substrate 10 made of n-type GaAs, a GaAs compound semiconductor is formed entirely by an epitaxial crystal growth method such as MOCVD (Metal Organic Chemical Vapor Deposition). As the material of the GaAs compound semiconductor, for example, trimethylaluminium (TMA), trimethylgallium (TMG), or arsine ($AsH_3$) is used. As the material of a donor impurity, for example, hydrogen selenide ($H_2Se$) is used. As the material of an acceptor impurity, for example, dimethyl zinc (DMZn) is used.

Concretely, first, on the substrate 10, the n-type contact layer 11, the light absorption layer 12, the p-type contact layer 13, the p-type first DBR layer 31, the p-type second DBR layer 32, the p-type third DBR layer 33, the active layer 22, and the n-type DBR layer 23 are stacked in this order from the substrate 10 side. Near the active layer 22 in the p-type third DBR layer 33, a layer (not illustrated) highly containing aluminum to become the first oxidation layer 41 is provided.

Subsequently, a mask (not shown) is formed on the surface of the n-type DBR layer 23 and, for example, by dry etching, the n-type DBR layer 23, the active layer 22, the p-type third DBR layer 33, and the p-type second DBR layer 32 are selectively etched, and therefore the first column 24 is formed. As a result, the aluminum-highly-containing layer (not shown) to become the first oxidation layer 41 and the low-refractive-index layer 32A to become the second oxidation layer 42 are exposed in the side face of the first column 24. Thereafter, the mask is removed.

Subsequently, oxidizing process is performed at high temperature in water-vapor atmosphere, and a part of the aluminum-highly-containing layer (not shown) and the low-refractive-index layer 32A is oxidized from the side face of the first column 24, thereby forming an insulating layer made of aluminum oxide. By the operation, the first oxidation layer 41 having the oxidation region 41B at the outer periphery of the current aperture 41A is formed, and the second oxidation layer 42 having the oxidation region 42B at the outer periphery of the current aperture 42A is formed.

After forming the first and second oxidation layers 41 and 42, in a manner similar to the above, by selectively removing the p-type first DBR layer 31, the p-type first DBR layer 31 is formed as the second column 25 having a cylindrical shape.

Subsequently, for example, by an evaporation method, the p-side electrode 14 is formed in the exposed part of the p-type contact layer 13. The n-side electrode 26 having the opening 26A is formed on the surface of the n-type DBR layer 23, and the n-side electrode 15 is formed on the rear face of the substrate 10. As described above, the semiconductor light emitting device illustrated in FIG. 1 is completed.

In the semiconductor light emitting device, when a predetermined voltage is applied across the p-side electrode 14 and the n-side electrode 26, current narrowed by the first oxidation layer 41 is injected to the light emission region 22A as the gain region in the active layer 22, and light is generated by recombination of electrons and holes. The light includes not only light generated by the induced emission but also light generated by natural emission. The induced emission repeats in the element, so that laser oscillation occurs at a predetermined wavelength $\lambda 0$, and light including the wavelength $\lambda 0$ is emitted to the outside and also slightly output to the semiconductor light detecting element 1.

The light which is output to the semiconductor light detecting element 1 is incident on the light absorption layer 12. A part of the light incident on the light absorption layer 12 is absorbed by the light absorption layer 12 and is converted to an electric signal (photocurrent) according to the output level of the absorbed light. The electric signal has magnitude according to the output level of the light incident on the light absorption layer 12. The electric signal is output to a light output computing circuit (not illustrated) via a wire (not illustrated) electrically connected to the p-side electrode 14 and the n-side electrode 15, and is received as a light output monitor signal in the light output computing circuit. In the light output computing circuit, on the basis of the light output monitor signal, the output level of light incident on the light absorption layer 12 in the semiconductor light detecting element 1 is measured.

Since one or more second oxidation layer 42 are provided between the active layer 22 and the semiconductor light detecting element 1, by a multilayer filter constructed by the second oxidation layer 42 and the high-refractive-index layer 32B, the induced emission light which is included in light output from the surface-emitting laser element 2 to the semiconductor light detecting element 1 side passes. On the other hand, since the natural emission light includes many divergence components, the natural emission light is reflection-scattered by the second oxidation layer 42, and propagation to the semiconductor light detecting element 1 side is suppressed. Therefore, the detection level of the natural emission light by the semiconductor light detecting element 1 decreases.

On the other hand, since a control layer is formed by oxidation in the semiconductor light detecting element in related art, a large stress is applied on the entire semiconductor light emitting device, and it causes device degradation and reliability deterioration. In the embodiment, since the second oxidation layer 42 is provided between the active layer 22 and the semiconductor light detecting element 1, the oxidation region 42B becomes narrower and the stress applied on the entire semiconductor light emitting device decreases. Therefore, the possibility that reliability deteriorates due to the degradation is reduced.

In the embodiment as described above, since the one or more second oxidation layers 42 are provided between the active layer 22 and the semiconductor light detecting element 1, propagation of the natural emission light to the semiconductor detecting element 1 is suppressed by the second oxidation layer 42, and light detection precision is increased. The first and second oxidation layers 41 and 42 are formed in a single oxidation process, and the manufacturing process becomes simpler.

Figure 3:
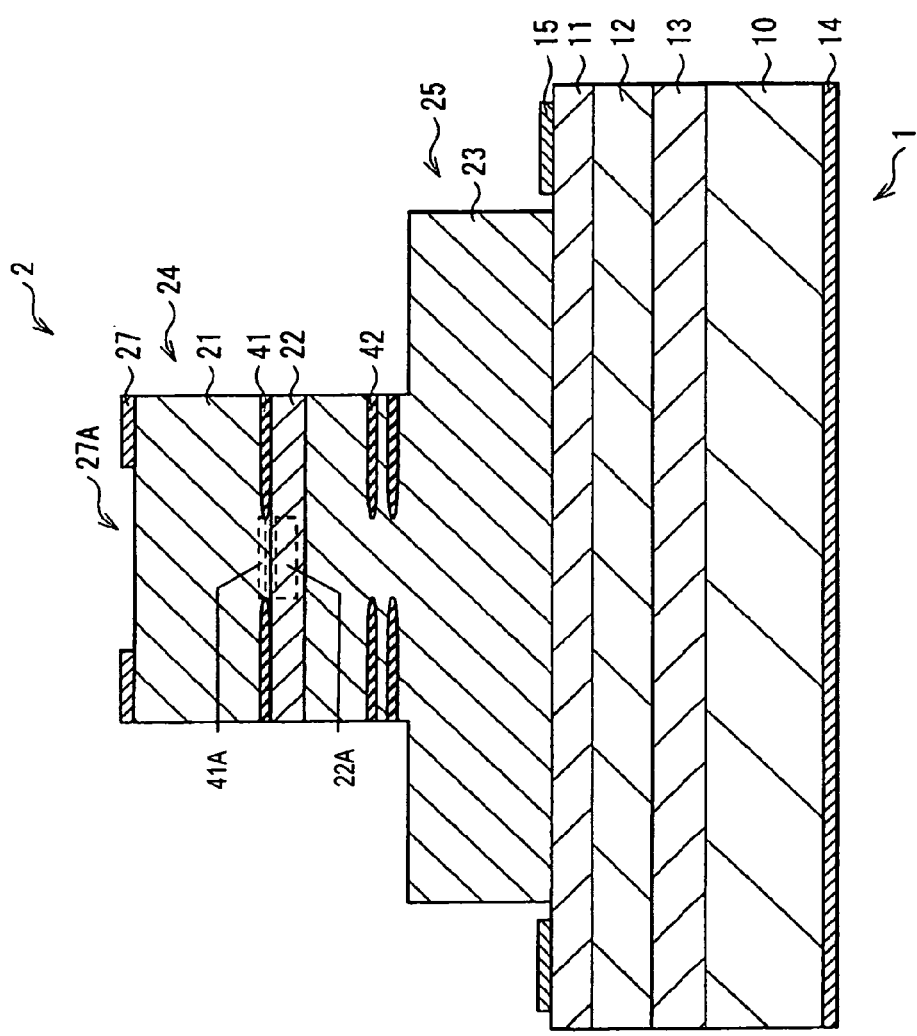
FIG. 3 is a cross section illustrating another configuration example of the semiconductor light emitting device illustrated in FIG. 1.

In the foregoing embodiment, the case where the n-type contact layer 11, the light absorption layer 12, the p-type contact layer 13, the p-type DBR layer 21 including the first and second oxidation layers 41 and 42, the active layer 22, and the n-type DBR layer 23 are stacked on the n-type substrate 10 in this order from the substrate 10 side has been described. However, as illustrated in FIG. 3, on the p-type substrate 10, the p-type contact layer 13, the light absorption layer 12, the n-type contact layer 11, the n-type DBR layer 23 including the second oxidation layer 42, the active layer 22, and the p-type DBR layer 21 including the first oxidation layer 41 may be stacked in this order from the substrate 10 side. In this case, it is preferable to provide the first oxidation layer 41 for the p-type DBR layer 21 in order to increase the current narrowing effect. Meanwhile, the second oxidation layer 42 may be provided for any of the p-type DBR layer 21 and the n-type DBR layer 23 as long as it is between the active layer 22 and the semiconductor light detecting element 1. In the semiconductor light emitting device illustrated in FIG. 3, the p-side electrode 14 of the semiconductor light detecting element 1 is provided on the rear side of the substrate 10, and the n-side electrode 15 is provided on the n-type contact layer 11. The n-side electrode of the surface-emitting semiconductor laser element 2 is used as the common electrode of the n-side electrode 15 of the semiconductor light detecting element 1. A p-side electrode 27 having an opening 27A is provided on the p-type DBR layer 21.

EXAMPLES

Further, concrete examples of the present invention will be described.

Example 1

In a manner similar to the foregoing embodiment, a semiconductor light emitting device having the surface-emitting semiconductor laser element 2 on the semiconductor light detecting element 1 was fabricated. A light output of the surface-emitting semiconductor laser element 2 and a monitor current value in the semiconductor light detecting element 1 in the obtained semiconductor light emitting device were examined. As illustrated in FIG. 4A, the monitor current value corresponding to a laser beam was detected with high precision.

Comparative Example 1

As comparative example 1 to the example 1, a semiconductor light emitting device was manufactured in a manner similar to the example 1 except that the second oxidation layer is not provided. Also with respect to the semiconductor light emitting device of the comparative example 1, the light output and the monitor current value were examined in a manner similar to the example 1. As illustrated in FIG. 4B, a monitor current value for natural emission light was detected before laser oscillation, and precision of the monitor current value to an actual laser beam was low.

In other words, it was understood that, by providing one or more second oxidation layers 42 between the active layer 22 and the semiconductor light detecting element 1, the monitor current value for a laser beam is detected with high precision, and light detection precision is increased.

Although the present invention has been described above by the embodiment and examples, the invention is not limited to the foregoing embodiment and examples but may be variously modified. For example, although the configuration of the semiconductor light detecting element 1 and the surface-emitting semiconductor laser element 2 has been concretely described in the foregoing embodiment, all of the layers do not have to be prepared or another layer may be further provided.

For example, the invention is not limited to the materials of the layers, film forming methods, and the like described in the foregoing embodiment. Other materials or other film forming methods may be employed.

Further, in the foregoing embodiment, the case where the GaAs compound semiconductor is used as the semiconductor material has been described. However, other materials such as a GaInP (red) material, an AlGaAs (infrared) material, and a GaN (blue-green) material may be used.

The present application contains subject matter related to that disclosed in Japanese Priority Patent Application JP 2009-248117 filed in the Japan Patent Office on Oct. 28, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light emitting device comprising:
    an active layer between a first multilayer reflection film of a first conductivity-type and a second multilayer reflection film of a second conductivity-type, a first oxidation layer being within said first multilayer reflection film or said second multilayer reflection film;
    a second oxidation layer between a different second oxidation layer and said active layer, said second oxidation layer and said different second oxidation layer both being within said second multilayer reflection film;
    an undoped light absorption layer between a first contact layer of the first conductivity-type and a second contact layer of the second conductivity-type, said second contact layer being between said second multilayer reflection film and said light absorption layer,
    wherein said second multilayer reflection film is between said second contact layer and said active layer.

2. The semiconductor light emitting device according to claim 1, wherein said first conductivity-type is n-type and said second conductivity-type is p-type when said first oxidation layer is within said second multilayer reflection film.

3. The semiconductor light emitting device according to claim 1, wherein said first conductivity-type is p-type and said second conductivity-type is n-type when said first oxidation layer is within said first multilayer reflection film.

4. The semiconductor light emitting device according to claim 1, wherein said light absorption layer is configured to convert a portion of light into an electric signal, said light being emissible from said active layer.

5. The semiconductor light emitting device according to claim 1, wherein said light absorption layer is $Al_xGa_{1-x}As$ ($0 \leqq x \leqq 1$).

6. The semiconductor light emitting device according to claim 1, wherein said second contact layer is $Al_xGa_{1-x}As$ ($0 \leqq x \leqq 1$).

7. The semiconductor light emitting device according to claim 1, wherein said first contact layer is $Al_xGa_{1-x}As$ ($0 \leqq x \leqq 1$).

8. The semiconductor light emitting device according to claim 1, wherein said first contact layer is between a substrate of the second conductivity-type and said light absorption layer.

9. The semiconductor light emitting device according to claim 8, wherein said substrate is GaAs.

10. The semiconductor light emitting device according to claim 8, further comprising:
    an electrode physically and directly electrically connected to said substrate.

11. The semiconductor light emitting device according to claim 1, further comprising:
    an electrode physically and directly electrically connected to said second contact layer.

12. The semiconductor light emitting device according to claim 11, further comprising:
    another electrode physically and directly electrically connected to said first multilayer reflection film.

13. The semiconductor light emitting device according to claim 1, wherein said second oxidation layer is an oxidized portion of a low-refractive-index layer, said low-refractive-index layer being between a high-refractive-index layer and another high-refractive-index layer.

14. The semiconductor light emitting device according to claim 13, wherein said different second oxidation layer is an oxidized portion of a different low-refractive-index layer, said high-refractive-index layer being between said low-refractive-index layer and said different low-refractive-index layer.

15. The semiconductor light emitting device according to claim 1, wherein a portion of the active layer is a light emission region, a current aperture through the second oxidation layer being between said light emission region and a current aperture through the different second oxidation layer.

16. The semiconductor light emitting device according to claim 15, wherein a non-oxidized portion of the second oxidation layer is said current aperture through the second oxidation layer, a non-oxidized portion of the different second oxidation layer being said current aperture through the different second oxidation layer.

17. The semiconductor light emitting device according to claim 16, wherein said non-oxidized portion of the second oxidation layer is AlAs or AlGaAs, said second oxidation layer being an aluminum oxide.

18. The semiconductor light emitting device according to claim 16, wherein said non-oxidized portion of the different second oxidation layer is AlAs or AlGaAs, said different second oxidation layer being an aluminum oxide.

19. The semiconductor light emitting device according to claim 15, wherein said current aperture through the second oxidation layer is between a current aperture through the different second oxidation layer and a current aperture through the first oxidation layer.

20. The semiconductor light emitting device according to claim 19, wherein a non-oxidized portion of the first oxidation layer is said current aperture through the first oxidation layer.

21. The semiconductor light emitting device according to claim 19, wherein said non-oxidized portion of the first oxidation layer is AlAs or AlGaAs, said first oxidation layer being an aluminum oxide.

22. The semiconductor light emitting device according to claim 19, wherein a diameter of said current aperture through the second oxidation layer is equal to or less than a diameter of said current aperture through the first oxidation layer.

23. The semiconductor light emitting device according to claim 19, wherein said first oxidation layer, said second oxidation layer, and said different second oxidation layer is an aluminum oxide.

24. The semiconductor light emitting device according to claim 1, wherein said light absorption layer is in physical contact with said first contact layer and said second contact layer.

25. The semiconductor light emitting device according to claim 1, wherein said second contact layer is in physical contact with said second multilayer reflection film and said light absorption layer.

26. The semiconductor light emitting device according to claim 1, wherein said second multilayer reflection film includes a second DBR layer of the second conductivity-type between a first DBR layer of the second conductivity-type and a third DBR layer of the second conductivity-type.

27. The semiconductor light emitting device according to claim 26, wherein said second oxidation layer and said different second oxidation layer are within said second DBR layer.

28. The semiconductor light emitting device according to claim 26, wherein said first oxidation layer is within said first DBR layer when said first conductivity-type is n-type and said second conductivity-type is p-type.

29. The semiconductor light emitting device according to claim 26, wherein said second and third DBR layers are within a first column and said first DBR layer is within a second column, a diameter of the second column being larger than a diameter of the first column.

* * * * *